United States Patent
Ramachandran et al.

(10) Patent No.: US 9,672,317 B2
(45) Date of Patent: Jun. 6, 2017

(54) QUALITY OF RESULTS SYSTEM

(71) Applicant: Synopsys, Inc., Mountain View, CA (US)

(72) Inventors: Aditya Ramachandran, Bangalore (IN); Girjesh Kumor Soni, Mahadevpura (IN)

(73) Assignee: Synopsys, Inc., Mountain View, CA (US)

( * ) Notice: Subject to any disclaimer, the term of this patent is extended or adjusted under 35 U.S.C. 154(b) by 126 days.

(21) Appl. No.: 14/645,395

(22) Filed: Mar. 11, 2015

(65) Prior Publication Data
US 2015/0261906 A1   Sep. 17, 2015

(30) Foreign Application Priority Data
Mar. 11, 2014   (EP) .................................. 14158863

(51) Int. Cl.
*G06F 17/50* (2006.01)
*G05B 19/418* (2006.01)

(52) U.S. Cl.
CPC ..... *G06F 17/5081* (2013.01); *G05B 19/4188* (2013.01); *G06F 17/5045* (2013.01); *G05B 2219/45031* (2013.01)

(58) Field of Classification Search
CPC ............. G06F 17/5045; G06F 17/5081; G06F 2217/12
USPC ......................................... 716/100, 106, 136
See application file for complete search history.

(56) References Cited

U.S. PATENT DOCUMENTS

| | | | |
|---|---|---|---|
| 2006/0155725 A1* | 7/2006 | Foster | G06F 17/30908 |
| 2008/0291917 A1* | 11/2008 | Cassod | H04L 41/22 370/392 |
| 2009/0307640 A1* | 12/2009 | Chapman | G06F 17/5045 716/136 |
| 2012/0096420 A1* | 4/2012 | Pandurangan | G06F 17/505 716/113 |

* cited by examiner

*Primary Examiner* — Paul Dinh
(74) *Attorney, Agent, or Firm* — HIPLegal LLP; Judith Szepesi

(57) ABSTRACT

Method and System for determining a next task in an Electronic Design Automation Flow, computer system and computer program product. One or more parsers configurable to identify one or more associated pre-defined data characteristics may be executed by a processor on a task output. Selected values obtained from the parser execution may be used to make a decision about the appropriate next action to be performed in the EDA flow. Selected values may provide suggestions or decisions about the appropriate next action to be performed in the EDA flow. Input for an associated task in the EDA flow may be suggested by the selected result values.

22 Claims, 11 Drawing Sheets

QUALITY OF RESULTS SYSTEM

RELATED APPLICATIONS

The present application claims priority to European Application No. 14158863.2 filed on Mar. 11, 2014, and incorporates that application by reference in its entirety.

FIELD

The present invention relates to electronic design automation (EDA), and in particular viewing and analyzing results in an EDA flow.

Design flow is the sequential set of operations used to transform an initial integrated circuit chip design through various intermediate design states to a final integrated circuit chip design that can be used to physically fabricate the integrated circuit chip. As the integrated circuit chip design passes through each task of the design flow, each associated resulting intermediate design state, and possibly prior intermediate design states and associated reports and outputs, are analyzed against target criteria representing, e.g., design goals, constraints and functional limitations. This analysis may be accomplished by a designer, e.g., a member of the integrated circuit chip design team or other individual or individuals examining the reports and outputs associated with that task of the design flow. The designer reviews one or more of the design states, outputs and reports and manually determines (with target criteria in mind as well as the designer's experience and judgment) whether the current intermediate design state has met or may/will meet the target criteria. If, in the judgment of the designer, the current intermediate design state has not or will not meet the design goals and functional limitations, the designer will attempt to determine, using any of the information available up to the present task, the underlying root cause(s) of the failure of this intermediate design state to meet the target criteria.

The target criteria may be one or more of various performance parameters that typically define timing needs, area availability and power goals, or other parameters that have been set for the ultimate integrated circuit chip resulting from the design flow. Throughout the design flow, typically if the each intermediate design state meets the target criteria, the next intermediate design state from the next task in the design flow also is more likely to also meet the target criteria, and therefore designer will move forward to the next task in the design flow. However, if the intermediate design state does not appropriately meet the target criteria, the designer may use their judgment and domain knowledge to determine the appropriate next action. The designer may modify the design flow and/or modify the design inputs and/or take other actions to enable a repeat of the design state through the current task in the design flow so that the resulting intermediate design state potentially meets the target criteria. The designer may determine that the way in which the intermediate isn't meeting one or more of the target criteria may be resolved by a later task in the design flow, and therefore begin the next task of the design flow. In this way, the quality of the results of the current task, i.e. the relationship of the present design state to the target criteria, from each task in the design flow is used to determine the next action in the design flow.

A large amount of information is generated at each task in the design flow in the form of reports and outputs. It is difficult, even for expert designers, to examine the volume of reports and outputs generated by each task in the design flow, or the cumulative information generated thus far, in a timely manner such that project deadlines and milestones are met for the finalization of the integrated circuit chip design. Additionally, there is a danger of misdiagnosing the root cause of the failure of one or more intermediate design states to meet one or more target criteria, and also a danger of a designer overlooking problems present in the reports and outputs, for example, through human error or lack of experience.

What is needed is a system to support a designer when interacting with the design flow, intermediate design states of the integrated circuit chip design, and associated reports and outputs to allow rapid assessment of whether the quality of results from the design task meets appropriate target criteria or, if not, provide support to the designer to more easily and reliably deduce the root cause for the failure to meet the target criteria, as well as make suitable adjustments to the design state or other inputs to a task for the next determined task in the design cycle.

Reports and outputs, including the intermediate design state, that are created from each task in the design flow are typically quite large, although the structure of the data that they contain usually follows a specific format, whether documented or undocumented. These reports and outputs contain information that the designer may consider when making a decision about the quality of results (QoR) from the design task. While some of the information needed by the designer may be explicitly present in the reports and outputs, other information needed by the designer may only be implicitly present in the reports and outputs, requiring additional, possibly extrinsic, information or judgment to be relevant to the QoR decision by the designer. The relevant information in the reports and outputs may only be a small portion of the actual substance. What is needed is a system and method to augment the present EDA design flow in support of more quickly or automatically, or for one or more designers, determine QoR for intermediate design states and next tasks for the design flow.

BRIEF DESCRIPTION OF THE FIGURES

The present invention is illustrated by way of example, and not by way of limitation, in the figures of the accompanying drawings and in which like reference numerals refer to similar elements and in which.

DETAILED DESCRIPTION

Figure 1:
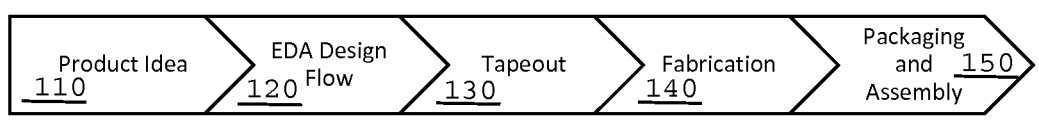
FIG. 1 illustrates various stages of design and fabrication of an integrated circuit.

In one embodiment, a parser apparatus for use in an EDA flow is disclosed. One or more parsers configurable to identify one or more associated pre-defined data characteristics are executed by a processor on a task output. Selected values obtained from the parser execution are used to make a decision about the appropriate next action to be performed in the EDA flow. In one embodiment, selected values may provide suggestions or decisions about the appropriate next action to be performed in the EDA flow. For example, in response to reviewing the selected result values, a prior task in the EDA flow may be re-executed with different input, or the next task in the EDA flow may be executed with the existing input, or the current task in the EDA flow may be re-executed with different input. The existing or different input for the associated task in the EDA flow may be suggested by the selected result values.

One or more task outputs may be parsed to provide a set of selected result values. One or more of the task outputs may be from the same task in the EDA flow. One or more of the task outputs may be from different tasks in the EDA flow. One or more of the task outputs may be from a different task than was most recently executed in the EDA flow. Selected result values may include one or more of a subset of data within the task output and a summary of data within the task output. The chosen subset of data may meet more than one of the pre-defined data characteristics. The chosen subset of data may associated with summary data. The selected result values may be provided in one or more of tabular form and graphical form. The selected result values may include suggestions for changes to a design in the EDA flow to overcome issues.

Parsers may be pre-defined or automatically created in response to a pre-defined data characteristic. Parsers may be created in response to the type of data present in a task output. Parsers may be chosen by a designer interacting with the EDA flow.

In one embodiment, parsers specific to each report and output type may be executed. The execution may be performed by a designer or the design flow. These parsers read task output files, extract the key information and write out smaller files containing only the key information. In this manner, the outputs for multiple tasks can be processed and a second much smaller file or sets of files containing only the extracted information can be created. A viewer that understands the format of the second files and the information contained therein may load these smaller files and may construct a report view containing the extracted information in a manner amenable to analysis such as an interactive table or plot or files such as images, text files or HTML files. The control of this viewer may be through user input via keyboard and mouse or via command files or a combination of both.

In another embodiment, the viewer itself may parse the design flow outputs and reports and may construct a report view containing the extracted information in a manner amenable to analysis such as an interactive table or plot. The viewer may write out the smaller second set of files for future use.

In yet another embodiment, the parsers may be operated by a computer or process independent of the design flow execution and may write out these second set of smaller files and a viewer apparatus loads them.

In yet another embodiment, the viewer apparatus may also support the query of values associated with the report views or the viewer output files as raw output (such as a string, a number or a set of strings or a set of numbers or a combination thereof) that may not result in the creation of interactive report views. The input in such cases may be a set of parameters of the data to return. For example, parameters may be the design name or pattern, task names or patterns and names of values to return (such as slack, or power). Any attribute of the data contained in the viewer output files may be used a search parameter to narrow down the list of returned values to the designer's satisfaction. In such an embodiment, another apparatus may utilize these returned values for their purpose.

In one embodiment, the design flow comprises a plurality of tasks, each task generates a first task output, each first task output includes a plurality of result values. The method parses the first task output of a task in the design flow and processes the parsed first task output. Using a pre-set rule with the parsing, a plurality of result values of the first task output are determined. A second task output is determined comprising a number of result values that is smaller than the plurality of result values of the first task output.

In one embodiment, a computer program comprising a processing unit, a storage medium and a display is configurable so that the processing unit is set up to process an electronic design automation flow, to save output data in the storage medium, to read saved data from the storage medium and to present output on the display for a user.

In one embodiment, the present invention with an understanding of the formats of reports or outputs generated by multiple EDA tools, may parse reports and outputs to find or calculate values and provides the designer a unified GYI interface through which they can analyze metrics from multiple tasks, designs and tools in a tool-independent manner. In one embodiment, designers may analyze design metrics as they execute tasks in a design flow via a single GUI interface. For example, a timing report that reports the worst timing paths in a design consists of multiple lines of cell names, pins, delay values and other detailed information. The designer, at first, is looking for one number in that file: the amount by which the paths in the design are violating timing, i.e. the negative slacks. In this situation, the current invention would parse the timing report and extract all the negative slacks for all the paths in the report and show the user a table of negative slacks thereby precluding the user from having to either know or understand the format of the report or to go through it to find the information they need. Different reports and outputs have different key values that a designer is looking for in them. The designer may be interested in the number of cells in the design from an area report, for example. Thus, it is required that each report and output type will have a specifically designed parser that extracts the key information contained within it.

EDA tools consist of different software modules performing a variety of tasks in the design flow, sometimes overlapping. Each software module may have independently executed software code or may be used as a part of an overarching EDA tool to process a specific task or tasks.

FIG. 1 illustrates the various stages of design and fabrication of an integrated circuit 100. The process starts with a product idea 110 having one or more portions that may be realized with an integrated circuit chip that may be designed using an EDA design flow process 120. The EDA design flow process 120 results in a design state representation of the integrated circuit chip that can be used to fabricate the integrated circuit chip, known as tapeout. After the design state representation is taped out in process task 130, fabrication process 140 is used to produce a physical version of the integrated circuit chip, which is then packaged and assembled in process task 150 to produce a robust integrated circuit chip for use in the physical embodiment of the product idea. Integrated circuit chip designs may also be implemented in a pre-fabricated and pre-packaged and assembled device, such as a field programmable gate array (FPGA). When using an FPGA, the design state representation of the integrated circuit chip from the EDA design flow is programmed into the FPGA.

Figure 2:
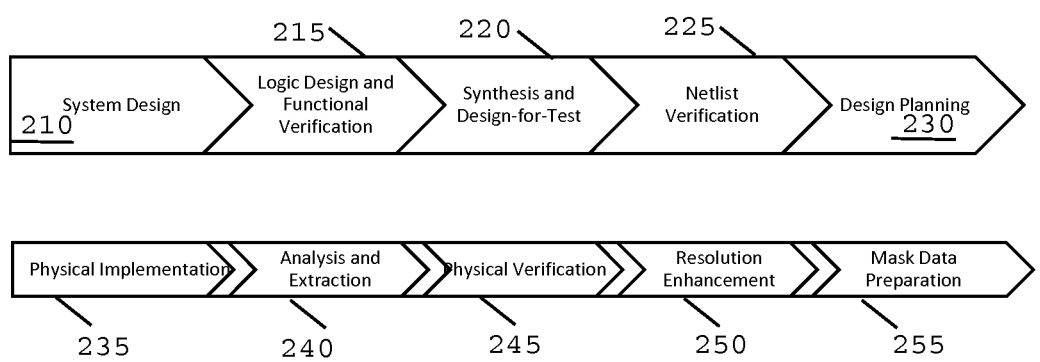
FIG. 2 illustrates an example design flow for the design and fabrication of an integrated circuit including outputs and reports.

The EDA design flow comprises multiple complex tasks that are performed, wherein each task incrementally transforms the integrated circuit chip design input into an integrated circuit chip output that can be taped out and potentially fabricated. Each task in the design flow can utilize one or more EDA tools (software modules) to perform the needed operations. A representative design flow 200 for the purposes of illustration is shown in FIG. 2.

During system design 210, circuit designers can describe the functionality that they want to implement. They can also perform what-if planning to refine functionality, check costs, etc. Hardware-software architecture partitioning can also occur at this stage. Exemplary EDA software products from Synopsys, Inc. that can be used at this task include Model Architect, Saber®, System Studio, and DesignWare®. During logic design and functional verification 215, the VHDL or Verilog code for modules in the system can be written and the design can be checked for functional accuracy, e.g., the design can be checked to ensure that it produces the correct outputs. Exemplary EDA software products from Synopsys, Inc. that can be used at this task include VCS®, Vera®, DesignWare®, Magellan™, Formality®, ESP and Leda®. During synthesis and design for test 120, the VHDL/Verilog can be translated to a netlist. Further, the netlist can be optimized for the target technology, and tests can be designed and implemented to check the finished chips. Exemplary EDA software products from Synopsys, Inc. that can be used at this task include Design Compiler®, Physical Compiler®, Test Compiler, Power Compiler™, FPGA Compiler, Tetra MAX®, and DesignWare®. During netlist verification 225, the netlist can be checked for compliance with timing constraints and for correspondence with the VHDL/Verilog source code. Exemplary EDA software products from Synopsys, Inc. that can be used at this task include Formality®, PrimeTime®, and VCS®. During design planning 230, an overall floorplan for the chip can be constructed and analyzed for timing and top-level routing. Exemplary EDA software products from Synopsys, Inc. that can be used at this task include Astro™ and IC-Compiler products. During physical implementation 235, circuit elements can be positioned in the layout (placement) and can be electrically coupled (routing). Exemplary EDA software products from Synopsys, Inc. that can be used at this task include Astro™ and IC Compiler products. During analysis and extraction 240, the circuit's functionality can be verified at a transistor level and parasitics can be extracted. Exemplary EDA software products from Synopsys, Inc. that can be used at this task include Astro Rail™, PrimeRail, PrimeTime®, and Star-RCXT™. During physical verification 245, the design can be checked to ensure correctness for manufacturing, electrical issues, lithographic issues, and circuitry. Hercules™ is an exemplary EDA software product from Synopsys, Inc. that can be used at this task. During resolution enhancement 250, geometric manipulations can be performed on the layout to improve manufacturability of the design. Exemplary EDA software products from Synopsys, Inc. that can be used at this task include Proteus/Progen, ProteusAF, and PSMGen. During mask data preparation 255, the design can be "taped-out" to produce masks which are used during fabrication. Exemplary EDA software products from Synopsys, Inc. that can be used at this task include the CATS® family of products.

Figure 3:
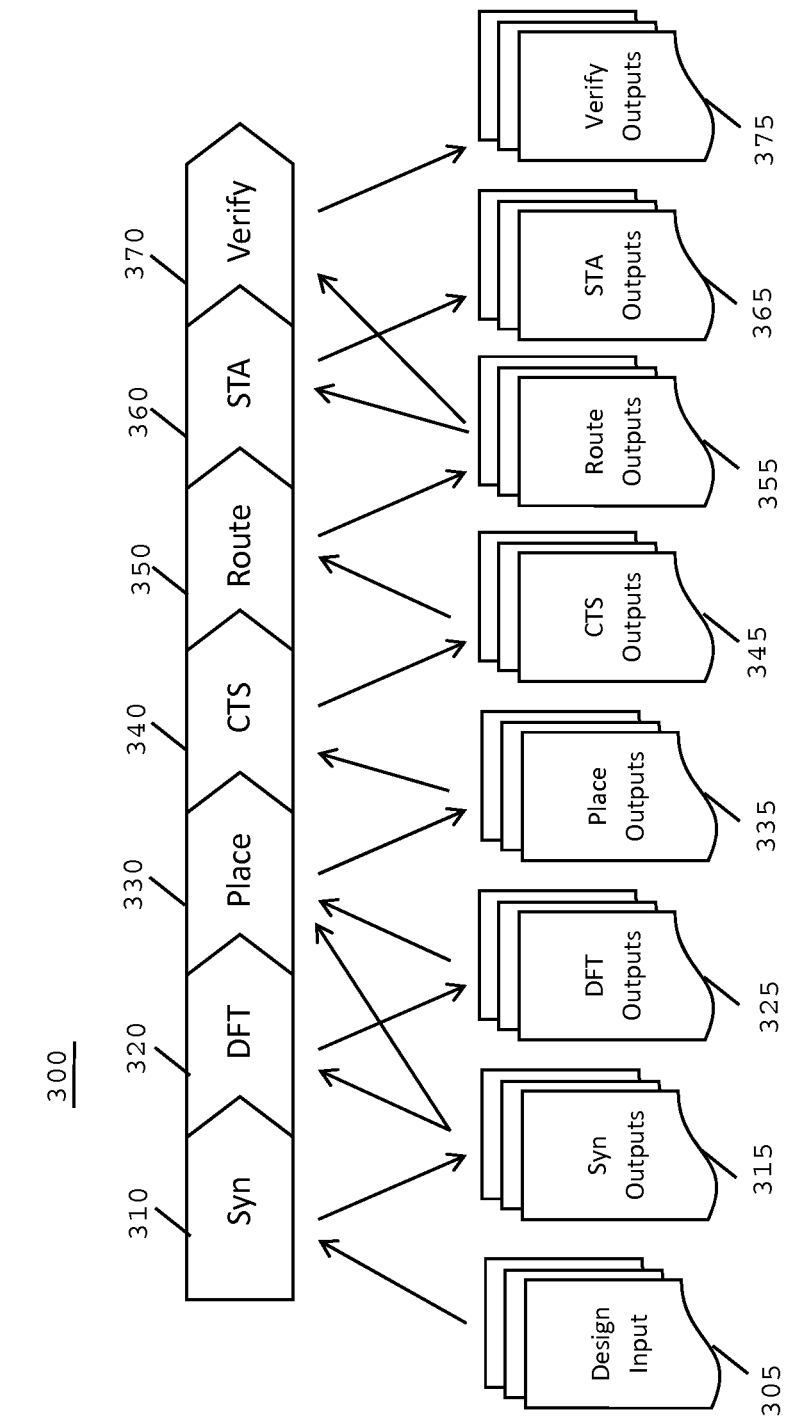
FIG. 3 illustrates an example design flow.

FIG. 3 illustrates in a generic manner the relationship between the tasks or tasks in a design flow and the associated storage of the results, in the form of outputs and reports, in an electronic storage medium, as well as the use of various task outputs as inputs to other tasks.

Representative design flow 300 consists of seven tasks shown in FIG. 3, starting with a design input source code 305 that is read into and processed by a task Syn 310. Each task in representative design flow 300 performs specific operations and creates reports and outputs to be stored in the storage medium, where those reports and outputs comprise transformations of the integrated circuit design, reports pertaining to the transformations themselves and the transformed integrated circuit design, as well as other pertinent task information, for example, log files. The tasks in representative design flow 300 perform the following operations.

Syn Task 310 converts input design source code 305 to a netlist representation of the integrated circuit design, which is among the data stored as Syn outputs 315.

DFT Task 320 reads the netlist from Syn Outputs 315 and performs insertion of test structures such as scan chains, storing this transformed integrated circuit design as a DFT netlist among the data stored as DFT Outputs 325.

Place Task 330 reads the DFT netlist from DFT Outputs 335, in addition to SYN Outputs 325 and places the design elements on a layout, storing the relevant information, including the Place database, in Place Outputs 345. In one embodiment, relevant information includes the further transformed integrated circuit design, CTS Task 340 reads the Place database from Place Outputs 345 and adds cells and wires to connect all flops to a clock source, storing the further relevant information, including the CTS database, in CTS Outputs 355.

Route Task 350 reads the CTS database from CTS Outputs 355 and adds wires to connect all the design elements in the manner connected in the netlist, storing the relevant information, including the Route database, in Route Outputs 365.

STA Task 360 reads the Route database from Route Outputs 365 and performs timing analysis to ensure design can meet required frequency of operation, storing the relevant information in STA Outputs 375.

Verify Task 370 also reads the Route Database from Route Outputs 365 to perform checking to ensure that the layout and design meets manufacturability design rules, and stores the relevant information in Verify Outputs 385.

Some of the tasks in FIG. 3 require reading input from more than one task output for proper operation. In this example, Place Task 330 reads the output of both DFT task 320 (associated output DFT Outputs 325) and Syn task 310 (associated output Syn Outputs 315) to produce Place output 335.

Figure 4:
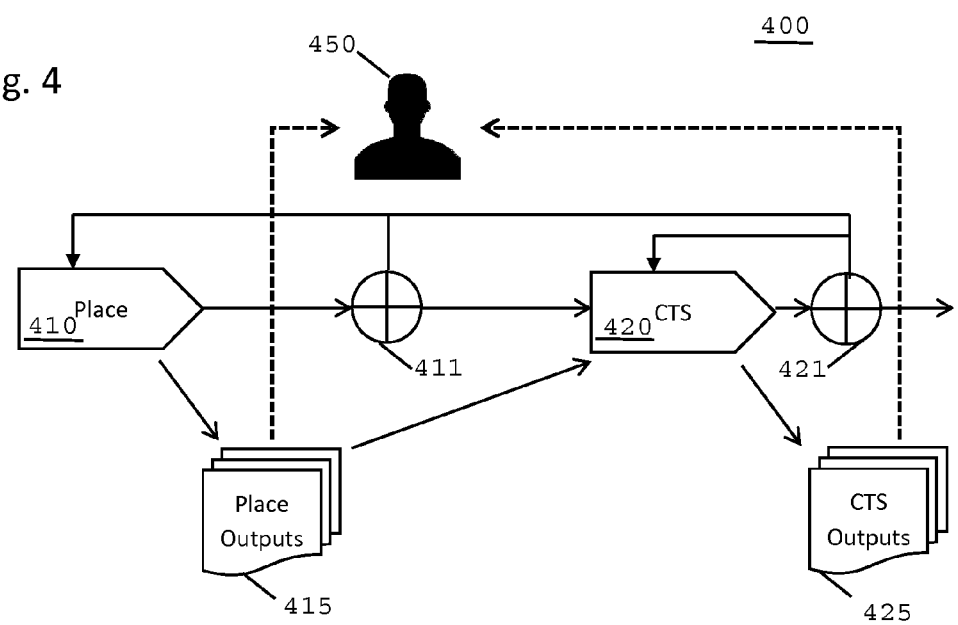
FIG. 4 illustrates an example relationship between an elements of a design flow.

FIG. 4 illustrates an example relationship between a subset of the elements of a design flow 400, including executing the tasks of the design flow, generating the task outputs and the designer executing the design flow. In the same manner of this example, one can readily apply this understanding to the complete design flow in FIG. 3 as well as extend this understanding to design flows consisting of any number of and type of tasks.

At the completion of every task in the design flow, the designer examines the outputs of the task to enable a determination of QoR, serving as the basis of the decision, for example, as to whether to continue to execute the next task in the design flow or instead to re-execute a previously executed task in the design flow with updated inputs to that task. Determining QoR and making the decision of which task to execute next typically involves examination of the appropriate task outputs to determine if the design is meeting or, in subsequent tasks, has a high probability of meeting the relevant target criteria set for the integrated circuit chip that is to be used in the device embodying the product idea. FIG. 4 shows two of these decision points, Place Decision Point 411 located after Place Task 410 and CTS Decision Point 421 located after CTS Task 420. Place Task 410 generates Place Outputs 415 and CTS Task 420 generates CTS Outputs 425. CTS Task 420 takes as inputs an intermediate design state from Place Task 410, Place Outputs 415 and may take as input additional designer or updated inputs as a result of CTS Decision Point 421. Place Task 410 may take as input additional designer or updated inputs as a result of CTS Decision Point 421. As illustrated in FIG. 4, in order to arrive at the decision needed after the execution of CTS Task 420, the designer may need to not only review CTS Outputs 415 but also Place Outputs 425. As shown, the designer may determine that the QoR meets the relevant target criteria or has a high probability of meeting the relevant target criteria at a subsequent task, and move to the next task in the design flow. Alternately, the designer may determine that the QoR may be improved by re-running CTS task 420 with an altered set of inputs. Alternately, the designer may decide that the QoR may be improved by re-running Place Task 410 with an altered set of inputs. Also illustrated is the possibility that the solution to a mediocre output in CTS Task 420 is the re-execution of Place Task 410 with new inputs. In Place Task 410, some example reports and outputs generated are as follows.

Timing Report—A report to show worst timing paths in the design. The designer examines this report to see if the integrated circuit design can meet frequency goals within the target criteria.

Area Report—A report to show the count and area of instances in the integrated circuit design netlist. The designer examines this report to see if the design meets area goals within the target criteria.

Power Report—A report to show the expected power that the ultimate device will consume. The designer examines this report to see if the integrated circuit design meets power goals within the target criteria.

Design Database—Database containing the placed design in a format understood by the EDA tools being used.

In CTS Task 420, reports similar to the reports in Place Task 410 are written out. Some additional reports are produced as well, examples as follows.

Clock Tree Report—A report to show the structure of the clock tree constructed by CT Task 420. The designer examines this report to see if the clock tree is of good quality in terms of number of instances added and its impact on timing and power of the device in accordance with the target criteria.

Power Report—A report to show the expected power that the ultimate device will consume. The designer examines this report to see if the design meets power goals in accordance with the target criteria.

An example of a go/no-go decision based on Place Outputs 415 is to examine the timing report that has data showing relevant to whether the design can operate at the specified frequency in the target criteria. If the disparity between the target frequency and the achieved frequency is too large, the designer may choose to rerun Place task 410 with additional or altered command inputs that are intended to increase the achievable frequency through, for example, more strenuous optimization. If the disparity between the target frequency and the achieved frequency is small, the designer may exercise judgment and choose to continue to CTS task 420 with the expectation of achieving the target frequency at a subsequent point in the design flow, for example, in a Route Task (not shown).

As is clear from the above, the decision of the designer at each step may include large amounts of detailed information on the current state of the design as well as large amounts of detailed information on the prior states of the design. To make a correct decision, the designer may need to review many of these reports, some of which may not be easily accessed or contain much greater information than is needed for the decision. In addition, the information may be spread across a very large number of reports.

Figure 5:
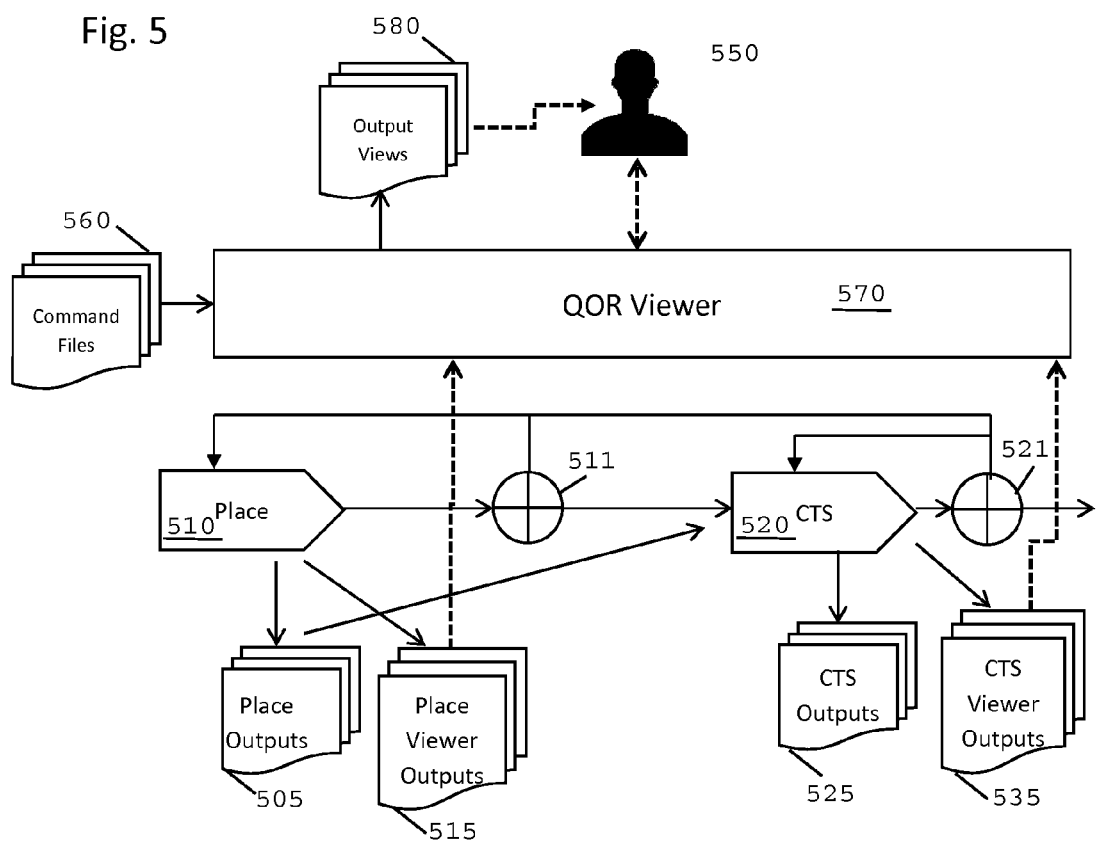
FIG. 5 illustrates an exemplary system in accordance with one embodiment of the present invention within a design flow.

FIG. 5 illustrates an exemplary system in accordance with one embodiment of the current invention within a design flow.

Two decision points in a design flow are shown in FIG. 5, Place Decision Point 511 located after Place Task 510 and CTS Decision Point 521 located after CTS Task 520. In one embodiment, Place Task 510 generates Place Outputs 505 and Place Viewer Outputs 515 and CTS Task 520 generates CTS Outputs 525 and CTS Viewer Outputs 535. In one embodiment, CTS Task 520 takes as inputs an intermediate design state from Place Task 510 and Place Outputs 515 and may take as input additional designer or updated inputs as a result of CTS Decision Point 521. Place Task 510 may take as input additional designer or updated inputs as a result of CTS Decision Point 521. QoR Viewer apparatus 570 receives Place Viewer Outputs 515 and CTS Viewer Outputs 535. In one embodiment, one or more tasks (task or product or function) in a design flow are augmented to additionally produce viewer outputs. In one embodiment, the augmentation executes parsers that extract and write out task viewer output files providing specific data relevant to a QoR decision. In one embodiment, the task viewer output files are extracted and written after the corresponding task operations have been completed and the typical task outputs provided. In one embodiment, the augmentation automatically determines the task viewer output files. In one embodiment, the augmentation uses inputs from command files to determine the task viewer output files.

Depending on the parsers used and relevant target criteria, vast amounts of data only a subset of which is applicable to a present decision in the design flow may be summarized into a much smaller subset of data. In one embodiment the subset of data is culled from one or more reports. In one embodiment, the reports are generated from one or more tasks in the design flow. In one embodiment, the report information is summarized. In one embodiment, the report information is shown graphically. In one embodiment, the report information is shown hierarchically, such that summary information may be further engaged to show detailed information pertaining that summary information. In one embodiment, the summary information includes suggestions for how to change the inputs to a task in the design flow to obtain a more beneficial result. In one embodiment, the result of the parsing results in an automated solution to change the inputs to a task in the design flow and automatic execution of the appropriate next task with those inputs.

Figure 6:
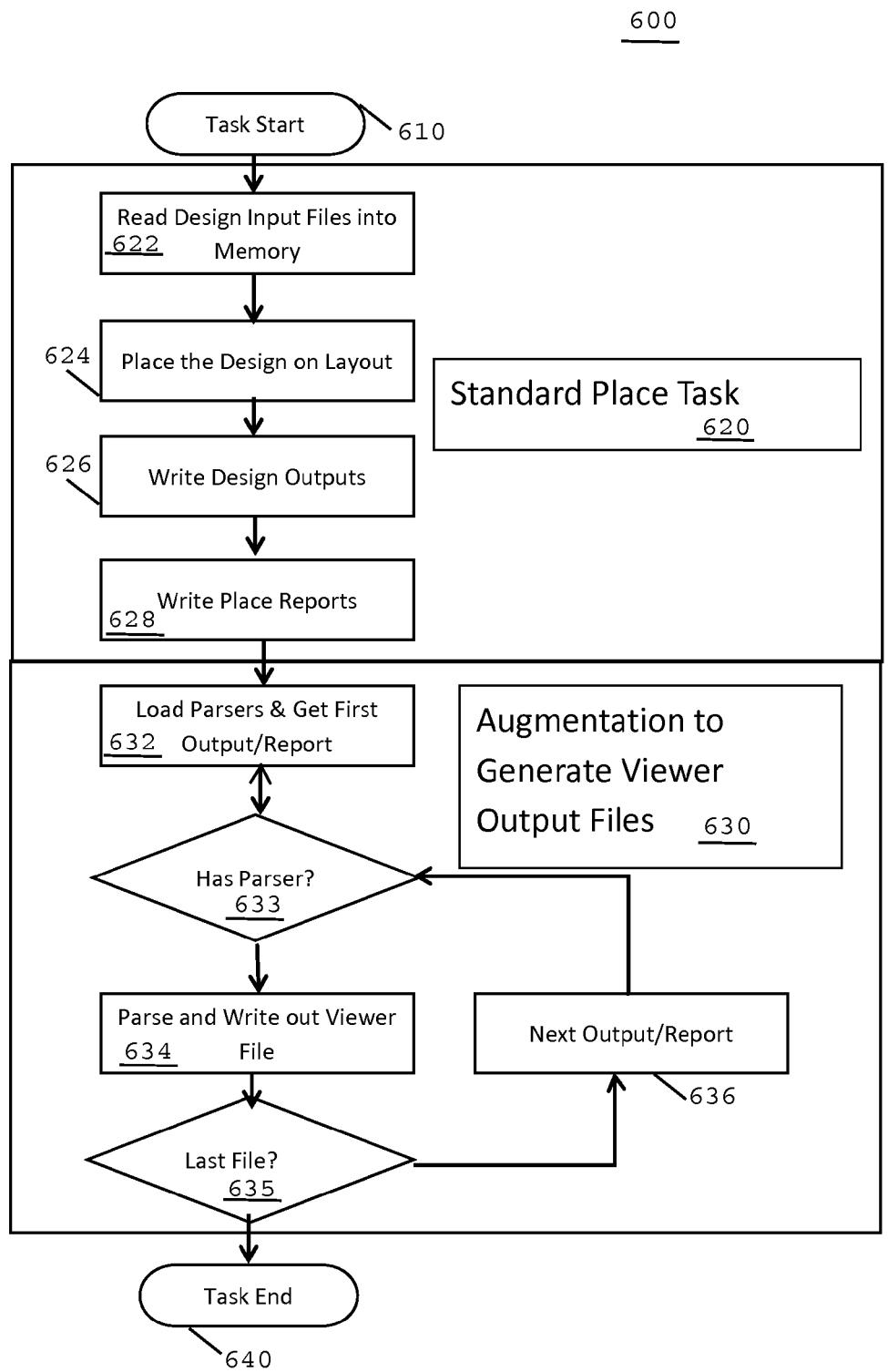
FIG. 6 illustrates a flowchart of one embodiment of the present invention in the place portion of a design flow.

FIG. 6 illustrates a flowchart of one embodiment of an operation of the present invention within a place task portion of a design flow.

Operation 600 starts with Task Start 610. Standard Place Task 620 reads intermediate integrated circuit design from input files generated by the prior design flow task at task 622. At task 624, Standard Place Task places the intermediate integrated circuit design onto a layout. At task 626, the new intermediate integrated circuit design database is written in the form of design outputs. Similarly, at task 628, Standard Place Task 620 writes out reports of information related to the new intermediate integrated circuit design and the placement operation that has occurred.

In one embodiment, Augmentation to Generate Viewer Output Files 630 has augmented Standard Place Task 620 to perform additional operations to generate place viewer files. In one embodiment, the augmentation then loads parsers appropriate for the design outputs generated in task 626 and place reports generated in task 628 to parse out information from those outputs and reports relevant to a QoR decision from a place task. In one embodiment, task 632 successively applies an appropriate parser for information contained in the outputs and reports to generate viewer output files. Specifically, the parsers are loaded in task 632 and the first of Standard Place Task 620 outputs and reports are examined, also in task 632. In task 633, a check is made to determine whether or not a parser within the parsers loaded in task 632 is appropriate for the information contained in the first of the outputs and reports. If no parser exists, another output and/or report is obtained in task 636 for an appropriate parser. If a parser exists for the information contained within the output or report currently under examination is parsed and written out to a task viewer file in task 634. If files still remain to examine, as determined in task 635, the next output and/or report is obtained in task 636. If this is the last file to be read, as determined in task 635, the process ends at Task End task 640. In one embodiment, content in the viewer outputs are a subset of information extracted from the task outputs and reports determined to be most relevant to a QoR decision at the current task stage in the design flow. In one embodiment, the following information may be parsed out by augmentations to exemplary design flow task reports.

Timing Report—augmentation may extract negative slack values as well as path startpoints and endpoints.

Area Report—augmentation may extract or calculate a count of objects, such as registers and non-registers Power Report—augmentation may extract or calculate a total power of an intermediate integrated circuit design.

In one embodiment, the QoR Viewer apparatus takes as inputs one or more viewer output files and provides the information contained in them to a viewer in the form of one or more report views. In one embodiment, the QoR Viewer apparatus processes the information contained within the one or more viewer output files into summary report views and/or recommendation report views. In one embodiment, report views may take the form of tables and/or graphs. In one embodiment, the QoR Viewer apparatus may display multiple reports or multiple independent copies of the same report via a tabbed interface.

In one embodiment, the designer interacts with the QoR Viewer Apparatus through a GUI interface. The viewer accesses functions of the GUI interface to perform their analysis as to a next task in the design flow. In one embodiment, the designer directs the QoR Viewer Apparatus to use the function "open new reports", which may access a viewer file or report different from the currently viewed report or a modified version of the current viewer file or report. In response, the QoR Viewer Apparatus may access and read viewer files or reports that contain the relevant information and display the requested or modified view to the designer. In one embodiment, an example interaction is to open a report corresponding to a different task in the design flow, or for a different design in a different design flow than the one being currently displayed. In one embodiment, an example would be to sort the values in displayed tables according to the values of a chosen column of data in the table.

In one embodiment, another mode of operation is to specify the viewer requests and commands in one or more command files or via terminal input that are processed by the QoR Viewer Apparatus to create output views that can then be viewed independently of the QoR Viewer Apparatus (such as images, textual reports or HTML files). In one embodiment, the command files or terminal input directs the QoR Viewer Apparatus to load specified views into the GUI interface.

In one embodiment, Outputs may include one or more of the intermediate design state, earlier intermediate design states, metadata, and summary information.

Figure 7:
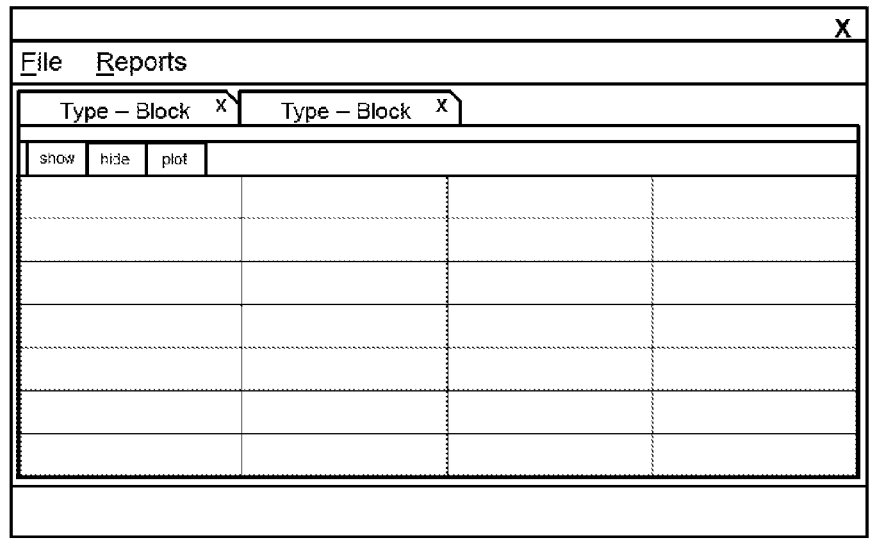
FIG. 7 illustrates a block diagram of one embodiment of the QoR Viewer apparatus graphical user interface (GUI)

FIG. 7 illustrates a block diagram of one embodiment of the QoR Viewer Apparatus GUI (graphical user interface).

GUI interface 700 has a top-level menu-bar listing actions and settings, for example opening report views, managing preferences and settings. Reports opened by the viewer are contained each within a report tab. In one embodiment of GUI interface 700, each report tab has an associated menu bar containing actions that pertain to the report the associated report. Different reports may have different actions available based on the report content and context. in one embodiment of GUI interface 700, the report view corresponding to a particular report tab may take the form of tables or graphs of data and associated actions to support interactive modes of operation, for example selection, sorting, context menus, query of values, as well as other actions that are of value depending on the report being displayed.

Figure 8:
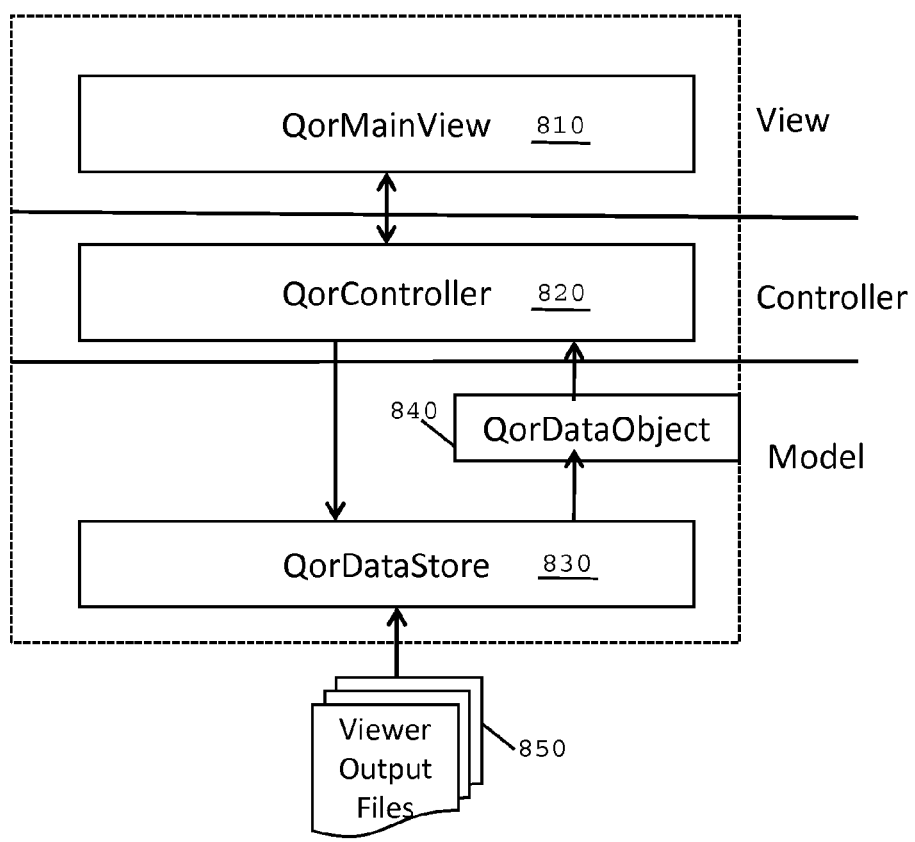
FIG. 8 illustrates a block diagram of an architecture in accordance with one embodiment of the QoR Viewer.

FIG. 8 illustrates a block diagram of an architecture in accordance with one embodiment of the QoR Viewer Apparatus.

In one embodiment, QoR Viewer Apparatus 800 comprises QorDataStore 830, one or more instances of QorDataObjects 840, QorController 820 and QorMainView 810. QoR Viewer Apparatus 800 takes as inputs Viewer Output Files 850. QorDataStore 830 maintains a list of Viewer Output Files 850 available to QoR Viewer Apparatus or that have been generated by tasks within the design flow along with relevant attributes (such as report type, time of creation of the report, design name and path). QorDataStore 830 may read one or more files from the disk, convert them to internal representations of QorDataObjects 840 and pass them onto QorController 820. In one embodiment, QorController 820 functions as a middle man. QorController 820 routes requests for Viewer Output Files 850 from the QorMainView 810 to QorDataStore 830. QorController 820 also routes Viewer Output Files 850 from the QorDataStore 830 to QorMainView 810. QorMainView 810 contains the visual aspect of the GUI interface. In one embodiment, Viewer Output Files 850 from QorDataObjects 840 are loaded into QorMainView 810 and shown in readily understandable form such as a graph or an interactive table on a display device.

Figure 9:
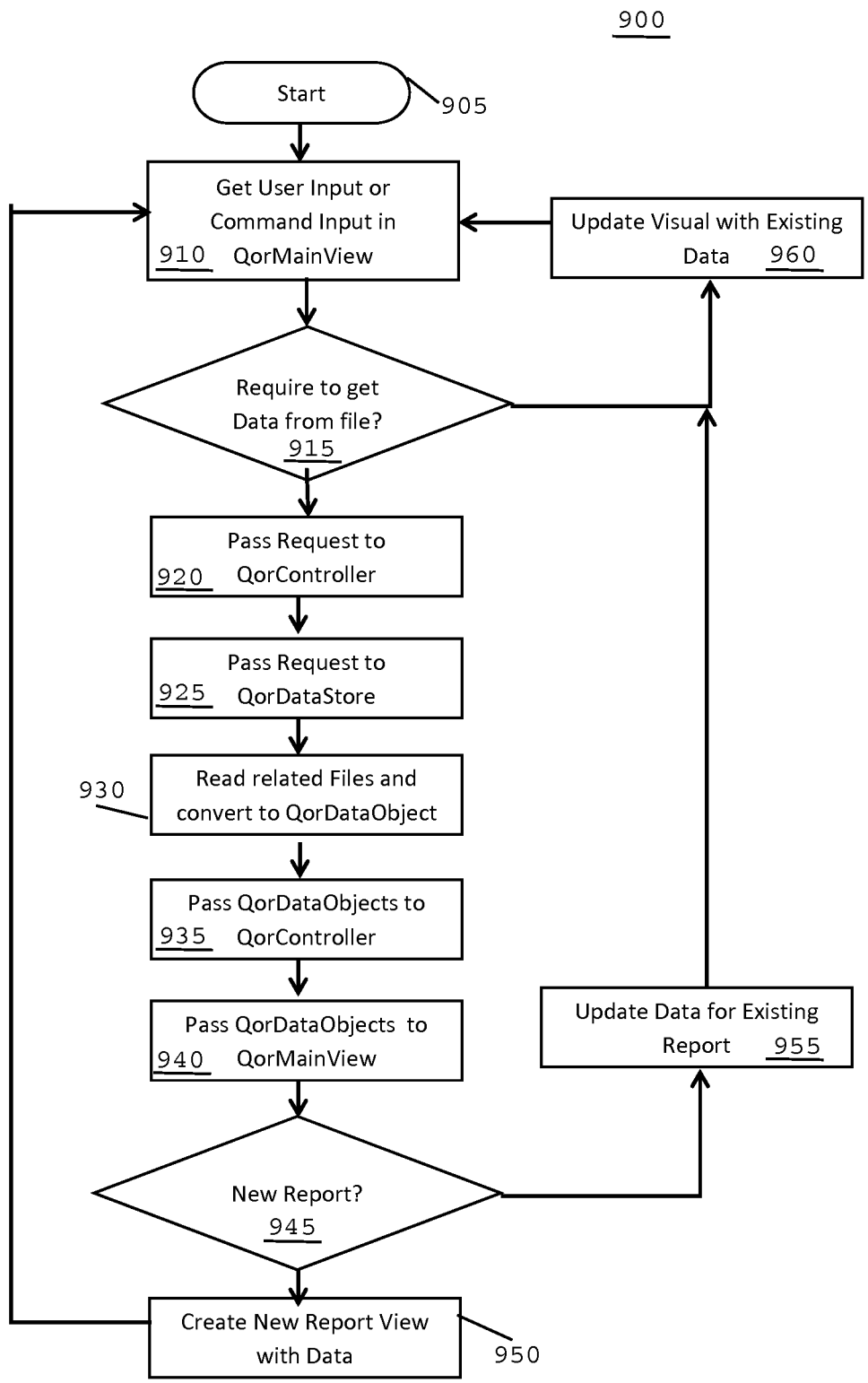
FIG. 9 illustrates a flowchart in accordance one embodiment of the QoR viewer.

FIG. 9 illustrates a flowchart in accordance with one embodiment of the QorViewer.

In one embodiment, an operational flow for QoR Viewer Apparatus 900 is shown. In one embodiment, when a new report is to be created, for example in QorMainView 810 of FIG. 8, an interactive table that compares timing for multiple design task tasks against each other is displayed to a designer. The designer may press a button or otherwise provide input to request a new report in the QorMainView to start operational flow 900 at start 905. Input is received in task 910. As a new report request, it may require the loading of viewer output files that were created by parsing timing reports, which is tested in decision block 915.

If no new data is required to respond to user input from task 910, then the visual is updated with existing data in task 960 and displayed to the user. For example, the designer may require a change in the visual presentation of existing data in the view. For example, hiding some rows or columns in a table. In such cases, the updated report is does not require additional data to provide the update requested in task 910 and the QorMainView updates the visual with existing data without having to refetch data from the QorDataStore in task 960.

If more data is required, the request gets forwarded to the QorDataStore in task 925 via the QorController task 920. The QorDataStore, upon receiving this request, checks in its list of files and reads in all the timing viewer output files it has, converts them to QorDataObjects in task 930 and passes them to the QorMainView in task 940 via the QorController in task 935. If no new report is required to be loaded, for example if the data needed already exists in QorDataStore from a prior report read, then a new QorDataObject is generated from existing data within QorDataStore in task 955. For example, if the designer requires the data being displayed in the current report view to change such as the addition of a new task column to the timing table being displayed in the view, then the data would already exist in QorDataStore. In this example, the QorMainView requests the incremental viewer files for the added task from the QorDataStore, updates the data of the existing report view in task 955 and updates the visual to show the added task column in task 960. In this case, a new view is not created. The QorMainView merely updates an existing view with new data and refreshes it.

If a new report is required to provide the response to the user from task 910 in decision task 945, then the QorMainView will then create a new interactive table in a new tab with this data in task 950. This new report view is then provide to the designer in response to the request in task 910.

Figure 10:
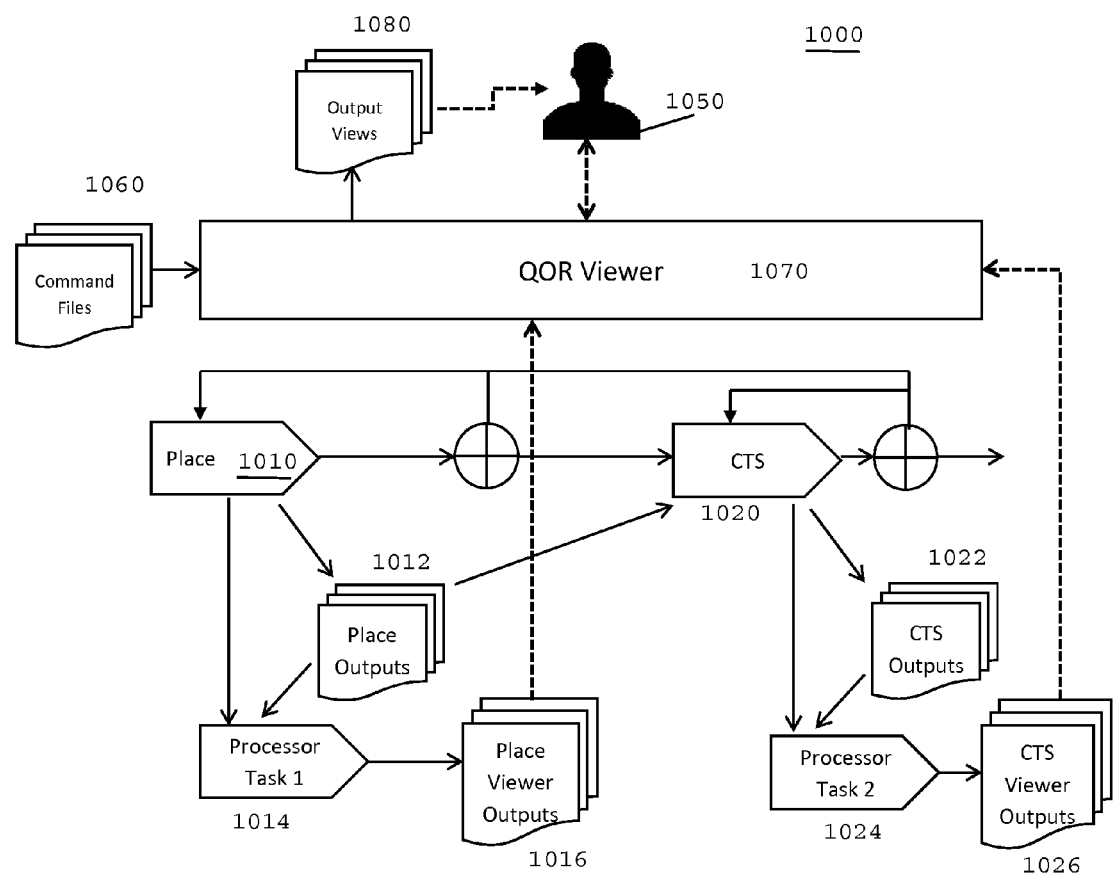
FIG. 10 illustrates another exemplary system in accordance with one embodiment of the present invention within a design flow.

FIG. 10 shows another embodiment of the current invention in conjunction with a design flow and the designer. In one embodiment, processor tasks (i.e. processor task module) separate from the design flow tasks execute one or more parsers to create the viewer. As shown, processor task 1 1014 and processor task 2 1024 each execute after the associated main task (Place Task 1010 for Processor Task 1 1014 and CTS Task 1020 for Processor Task 2 1024) has completed executing and after the creation of the outputs that the processor tasks take as input (Place Outputs 1012 for Place Task 1010 and CTS Outputs 1022 for CTS Task 1020). In one embodiment, the processor tasks contain only the subset of tasks described in Operation 600 in FIG. 6 that pertain to loading parsers and generating viewer output files for each output and report type supported by the parsers.

Figure 11:
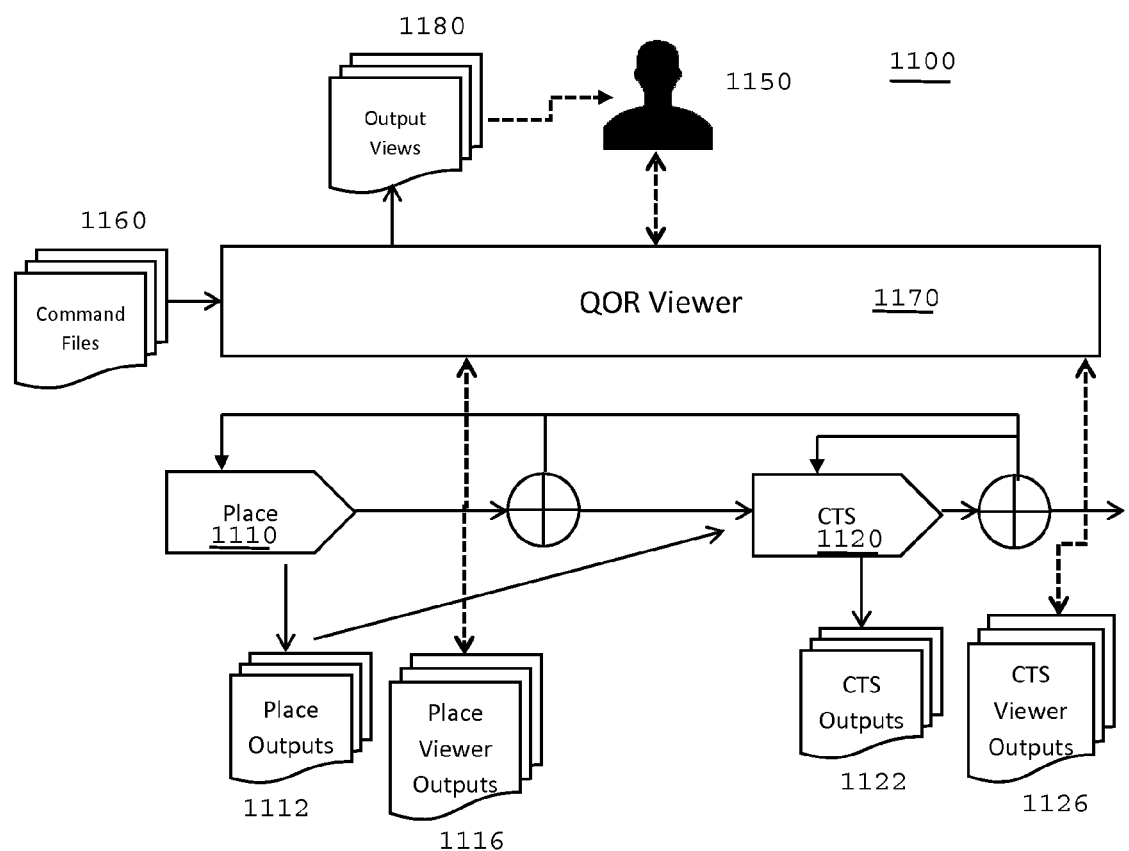
FIG. 11 illustrates another exemplary system in accordance with one embodiment of the present invention within a design flow.

FIG. 11 shows another embodiment of the current invention in conjunction with a design flow and the designer. In this embodiment, QoR Viewer Apparatus 1170 parses task output files (for example, Place Outputs 1112 and CTS Outputs 1122) and creates the viewer outputs (for example, Place Viewer Outputs 1116 and CTS Viewer Outputs 1126) as part of its operation. The viewer outputs created may be directly processed in memory or other computer readable storage media to create report views, be written out to be loaded at a future time or both.

Figure 12:
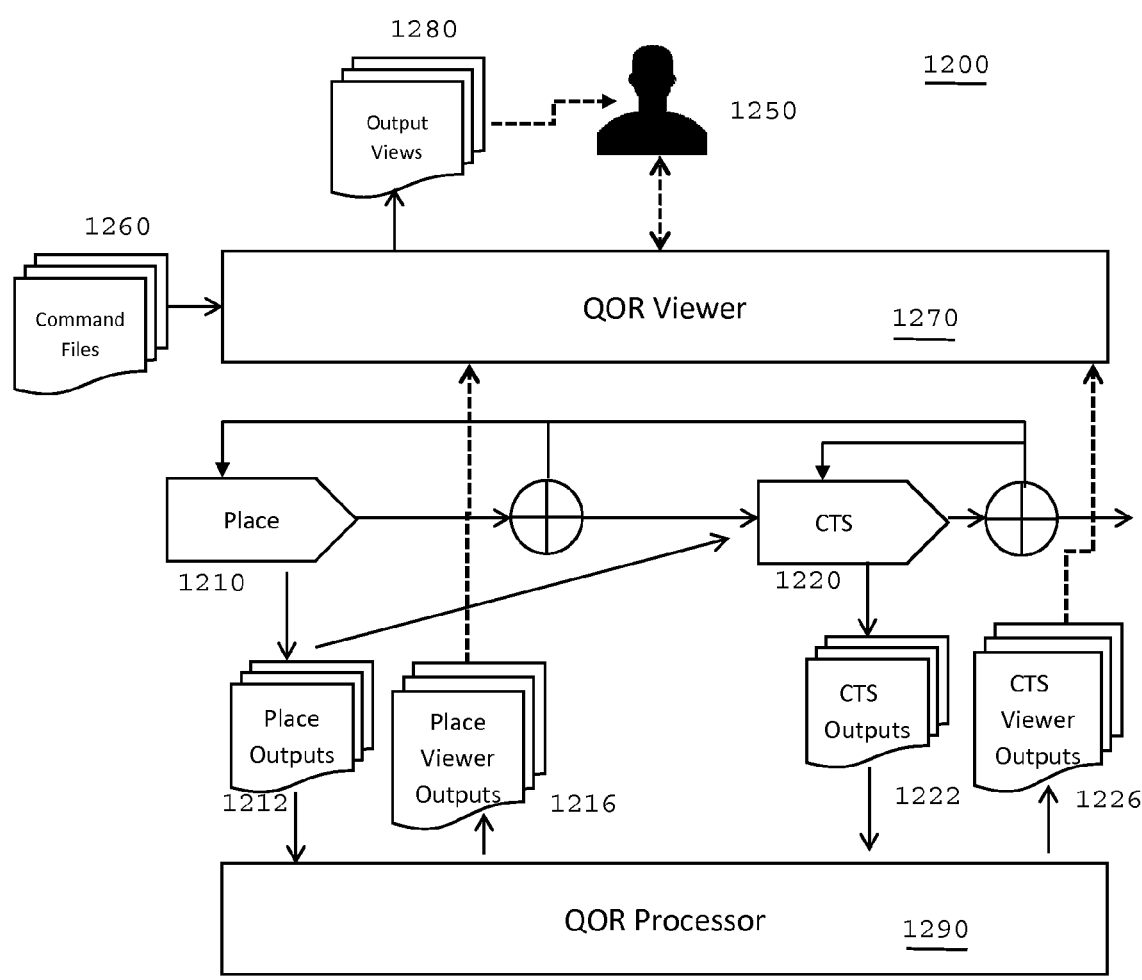
FIG. 12 illustrates another exemplary system in accordance with one embodiment of the present invention within a design flow.

FIG. 12 shows another embodiment of the current invention in conjunction with a design flow and the designer. In one embodiment, QOR Processor Apparatus 1290 (i.e. task viewer processor module) executes parser code that reads the task output files (for example, Place Outputs 1212 and CTS Outputs 1222 and creates task viewer outputs (Place Viewer Outputs 1216 and CTS Viewer Outputs 1226) as part of its operation. The Viewer Outputs 1216 and 1226 are written out to be loaded at a future time by QoR Viewer Apparatus 1270. QOR Processor Apparatus 1290 may operate in task with the design flow tasks, executing relevant processor code as the tasks complete or execute independently of the design flow as a separate process.

Figure 13:
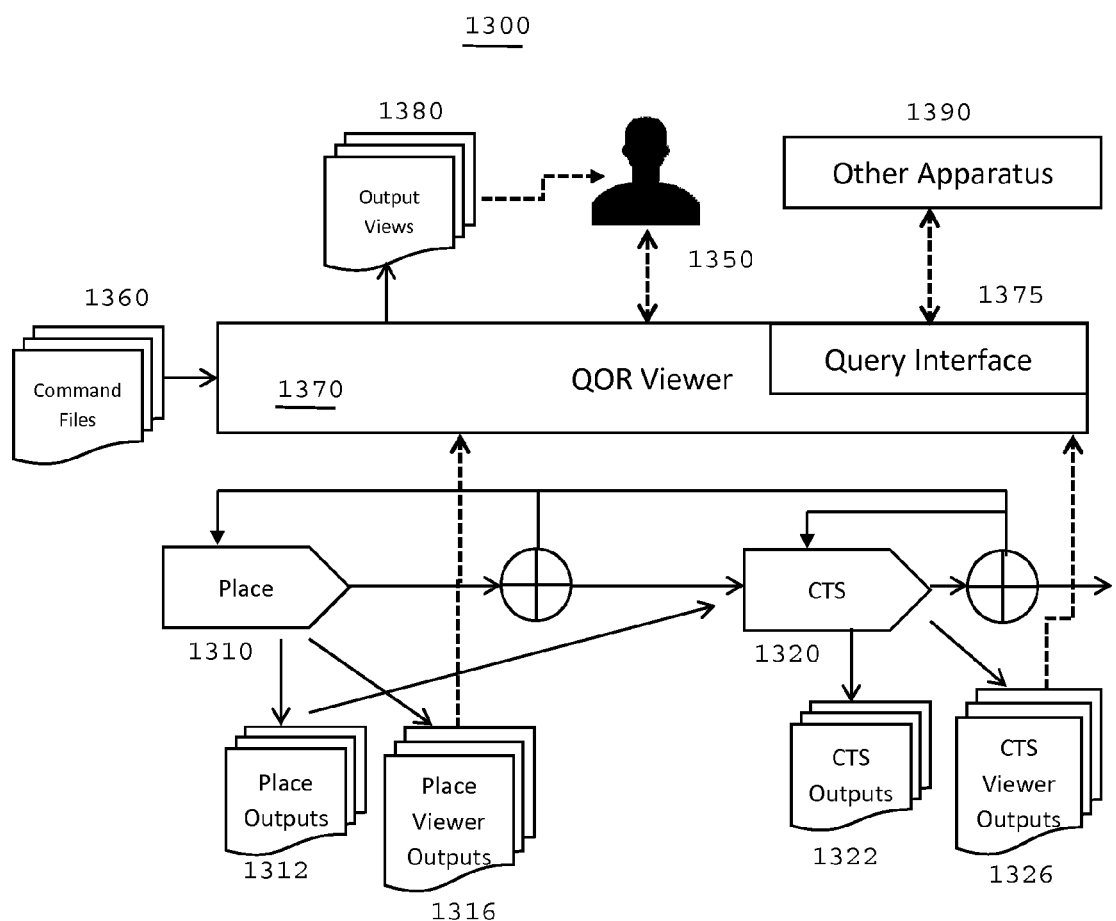
FIG. 13 illustrates another exemplary system in accordance with one embodiment of the present invention within a design flow.

FIG. 13 shows another embodiment of the current invention. In one embodiment, an apparatus 1390 queries QoR Viewer 1370 through Query Interface 1375 for values contained in supported report views (the value contained in a particular cell in a table or point in the graph) or the viewer output files. The input is parameters for which to return values. These parameters may be the names of the design, task names, value types and other attributes of the data contained within the viewer output files. The output is in a computer-understandable raw format such as a string, number or a set of string and numbers. For example, apparatus 1390 may query QoR Viewer 1370 for the value of the "worst negative slack" for a design named "dhm" at "place" task. In this example, the parameters are:

Task="place"

Design="dhm"

Value name="Worst Negative Slack"

The QoR Viewer 1370 queries the value from the CTS Viewer Outputs 1326 for dhm at the end of Place Task 1310 and will return it as a raw number.

This description and drawings are illustrative of embodiments of the invention and are not to be construed as limiting the invention. Numerous specific details are described to provide a thorough understanding of the disclosed embodiments. However, in certain instances, well known or conventional details are not described in order to avoid obscuring the description of the disclosed embodiments. References to "an" or "one" embodiment in the present disclosure are not necessarily to the same embodiment; such references mean at least one embodiment.

Many of the methods of the disclosed embodiments may be performed with a digital processing system, such as a conventional, general-purpose computer system. Special purpose computers, which are designed or programmed to perform only one function, may also be used.

Figure 14:
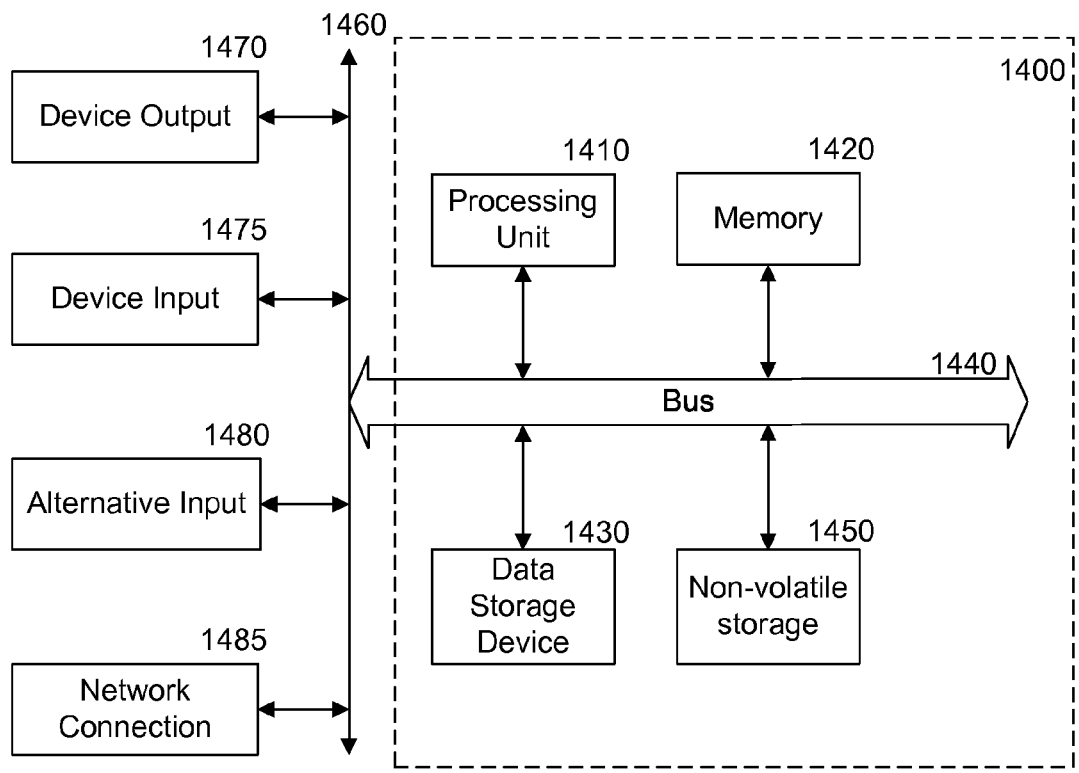
FIG. 14 illustrates one embodiment of a computer system for use with the present invention.

FIG. 14 is a block diagram of a particular data processing system that may be used with the present invention. It will be apparent to those of ordinary skill in the art, however that other alternative systems of various system architectures may also be used.

The data processing system illustrated in FIG. 14 includes a bus or other internal communication means 1440 for communicating information, and a processing unit 1410 coupled to the bus 1440 for processing information. The processing unit 1410 may be a central processing unit (CPU), a digital signal processor (DSP), or another type of processing unit 1410.

The system further includes, in one embodiment, a random access memory (RAM) or other volatile storage device 1420 (referred to as memory), coupled to bus 1440 for storing information and instructions to be executed by processor 1410. Main memory 1420 may also be used for storing temporary variables or other intermediate information during execution of instructions by processing unit 1410.

The system also comprises in one embodiment a read only memory (ROM) 1450 and/or static storage device 1450 coupled to bus 1440 for storing static information and instructions for processor 1410. In one embodiment, the system also includes a data storage device 1430 such as a magnetic disk or optical disk and its corresponding disk drive, or Flash memory or other storage which is capable of storing data when no power is supplied to the system. Data storage device 1430 in one embodiment is coupled to bus 1440 for storing information and instructions.

The system may further be coupled to an output device 1470, such as a cathode ray tube (CRT) or a liquid crystal display (LCD) coupled to bus 1440 through bus 1460 for outputting information. The output device 1470 may be a visual output device, an audio output device, and/or tactile output device (e.g. vibrations, etc.)

An input device 1475 may be coupled to the bus 1460. The input device 1475 may be an alphanumeric input device, such as a keyboard including alphanumeric and other keys, for enabling a user to communicate information and command selections to processing unit 1410. An additional user input device 1480 may further be included. One such user input device 1480 is cursor control device 1480, such as a mouse, a trackball, stylus, cursor direction keys, or touch screen, may be coupled to bus 1440 through bus 1460 for communicating direction information and command selections to processing unit 1410, and for controlling movement on display device 1470.

Another device, which may optionally be coupled to computer system 1400, is a network device 1485 for accessing other nodes of a distributed system via a network. The communication device 1485 may include any of a number of commercially available networking peripheral devices such as those used for coupling to an Ethernet, token ring, Internet, or wide area network, personal area network, wireless network or other method of accessing other devices. The communication device 1485 may further be a null-modem connection, or any other mechanism that provides connectivity between the computer system 1400 and the outside world.

Note that any or all of the components of this system illustrated in FIG. 14 and associated hardware may be used in various embodiments of the present invention.

It will be appreciated by those of ordinary skill in the art that the particular machine that embodies the present invention may be configured in various ways according to the particular implementation. The control logic or software implementing the present invention can be stored in main memory 1420, mass storage device 1430, or other storage medium locally or remotely accessible to processor 1410.

It will be apparent to those of ordinary skill in the art that the system, method, and process described herein can be implemented as software stored in main memory 1420 or read only memory 1450 and executed by processor 1410. This control logic or software may also be resident on an article of manufacture comprising a computer readable medium having computer readable program code embodied therein and being readable by the mass storage device 1430 and for causing the processor 1410 to operate in accordance with the methods and teachings herein.

The present invention may also be embodied in a handheld or portable device containing a subset of the computer hardware components described above. For example, the handheld device may be configured to contain only the bus 1440, the processor 1410, and memory 1450 and/or 1420.

The handheld device may be configured to include a set of buttons or input signaling components with which a user may select from a set of available options. These could be considered input device #1 1475 or input device #2 1480. The handheld device may also be configured to include an output device 1470 such as a liquid crystal display (LCD) or display element matrix for displaying information to a user of the handheld device. Conventional methods may be used to implement such a handheld device. The implementation of the present invention for such a device would be apparent to one of ordinary skill in the art given the disclosure of the present invention as provided herein.

The present invention may also be embodied in a special purpose appliance including a subset of the computer hardware components described above, such as a kiosk or a vehicle. For example, the appliance may include a processing unit 1410, a data storage device 1430, a bus 1440, and memory 1420, and no input/output mechanisms, or only rudimentary communications mechanisms, such as a small touch-screen that permits the user to communicate in a basic manner with the device. In general, the more special-purpose the device is, the fewer of the elements need be present for the device to function. In some devices, communications with the user may be through a touch-based screen, or similar mechanism. In one embodiment, the device may not provide any direct input/output signals, but may be configured and accessed through a website or other network-based connection through network device 1485.

It will be appreciated by those of ordinary skill in the art that any configuration of the particular machine implemented as the computer system may be used according to the particular implementation. The control logic or software implementing the present invention can be stored on any machine-readable medium locally or remotely accessible to processor 1410. A machine-readable medium includes any mechanism for storing information in a form readable by a machine (e.g. a computer). For example, a machine readable medium includes read-only memory (ROM), random access memory (RAM), magnetic disk storage media, optical storage media, flash memory devices, or other storage media which may be used for temporary or permanent data storage and may be computer readable. In one embodiment, the control logic may be implemented as transmittable data, such as electrical, optical, acoustical or other forms of propagated signals (e.g. carrier waves, infrared signals, digital signals, etc.).

In the foregoing specification, the disclosed embodiments have been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

We claim:

1. A parser apparatus for use in an electronic design automation design flow, the parser apparatus stored in a computer readable storage device, the parser apparatus comprising:
   a parser to parse task output containing data relevant to a quality of results (QoR) decision and identify a pre-defined data characteristic in the task output; and
   a processor to execute the parser upon receipt of the task output,
   wherein selected result values obtained from the parser execution are used to make a decision, manually or automatically, about a next action to be performed in the design flow, and
   wherein the design flow process results in a design state representation and the design state representation is used to fabricate an integrated circuit.

2. The parser apparatus of claim 1, wherein the processor is part of a task in the design flow.

3. The parser apparatus of claim 1, the parser apparatus further comprising:
   a second parser to identify a second pre-defined data characteristic in the task output; and
   the processor further to execute the second parser,
   wherein second selected result values obtained from the second parser execution are also used to make the decision about the next action to be performed in the design flow.

4. The parser apparatus of claim 1, where the selected result values comprise one or more of a summary of data within the task output meeting the pre-defined data characteristic and a subset of data within the task output meeting the pre-defined data characteristic.

5. The parser apparatus of claim 1, the parser apparatus further comprising:
   a second parser to identify a second pre-defined data characteristic in a second task output; and
   the processor further to execute the second parser, wherein second selected result values obtained from the second parser execution are also used to make the decision about the next action to be performed in the design flow.

6. The parser apparatus of claim 5, wherein the task output and the second task output are generated by one of: the same task in the design flow or different tasks in the design flow.

7. The parser apparatus of claim 1, wherein the task output analyzed by the parser comprises one or more of: a timing report, an area report, a power report.

8. A method for determining a next action in an electronic design automation design flow, the method comprising:
   identifying a parser configurable to parse task viewer output files and parse a task output upon receipt of the task output;
   obtaining a pre-defined data characteristic relevant to data contained within the task output; and
   executing by use of a processor the parser on the task output to parse selected result values from the task output relevant to the pre-defined data characteristic,
   wherein the selected result values are viewed in a QoR viewer and are used to make a decision, manually or automatically, about a next action to be performed in the design flow.

9. The method of claim 8 further comprising:
   executing a task in the design flow, wherein the executing the task comprises the executing the parser.

10. The method of claim 8 further comprising:
    identifying a second parser configurable to parse the task output upon receipt of the task output;
    obtaining a second pre-defined data characteristic relevant to data contained within the task output; and
    executing the second parser on the task output to parse second selected result values from the task output relevant to the second pre-defined data characteristic,
    wherein the second selected result values are also used to make the decision about the next action to be performed in the design flow.

11. The method of claim 8, where the selected result values comprise one or more of a summary of data within the task output meeting the pre-defined data characteristic and a subset of data within the task output meeting the pre-defined data characteristic.

12. The method of claim 8 further comprising:
    identifying a second parser configurable to parse a second task output upon receipt of the second task output;
    obtaining a second pre-defined data characteristic relevant to data contained within the second task output; and
    executing the second parser on the second task output to parse second selected result values from the second task output relevant to the second pre-defined data characteristic,
    wherein the second selected result values are also used to make the decision about the next action to be performed in the design flow.

13. The method of claim 12, wherein the task output and the second task output are generated by the same task in the design flow.

14. The method of claim 12, wherein the task output and the second task output are generated by different tasks in the design flow.

15. A machine readable medium containing executable computer program instructions which, when executed by a digital processing system, cause said system to perform a method for determining a next action in an electronic design automation design flow, the method comprising:
    identifying a parser to parse task files containing specific data relevant to a QoR decision and parse a task output upon receipt of the task output;
    obtaining a pre-defined data characteristic relevant to data contained within the task output; and
    executing the parser on the task output to parse selected result values from the task output relevant to the pre-defined data characteristic,
    wherein the selected result values are viewed in a QoR viewer and used to make a decision, manually or automatically, about a next action to be performed in the design flow, and
    wherein the design flow process results in a design state representation and the design state representation is used to fabricate an integrated circuit.

16. The medium of claim 15, the method further comprising:
    executing a task in the design flow, wherein the executing the task comprises the executing the parser.

17. The medium of claim 15, the method further comprising:
    identifying a second parser configurable to parse the task output upon receipt of the task output;
    obtaining a second pre-defined data characteristic relevant to data contained within the task output; and
    executing the second parser on the task output to parse second selected result values from the task output relevant to the second pre-defined data characteristic, wherein the second selected result values are also used to make the decision about the next action to be performed in the design flow.

18. The medium of claim 15, where the selected result values comprise one or more of a summary of data within the task output meeting the pre-defined data characteristic and a subset of data within the task output meeting the pre-defined data characteristic.

19. The medium of claim 15, the method further comprising:
identifying a second parser configurable to parse a second task output upon receipt of the second task output;
obtaining a second pre-defined data characteristic relevant to data contained within the second task output; and
executing the second parser on the second task output to parse second selected result values from the second task output relevant to the second pre-defined data characteristic,
wherein the second selected result values are also used to make the decision about the next action to be performed in the design flow.

20. The medium of claim 19, wherein the task output and the second task output are generated by different tasks in the design flow.

21. The parser apparatus of claim 7, wherein the selected result values obtained from the task report comprise one or more of:
from the timing report: a negative slack, path start points, path end points;
from the area report: object counts; and
from the power report: total power of an intermediate integrated circuit design.

22. The parser apparatus of claim 1, wherein the next action to be performed comprises one of: re-executing a prior task in the EDA flow with different inputs, executing a next task in the EDA flow with existing inputs, or re-executing a current task in the EDA flow with the different inputs.

* * * * *